(12) United States Patent
Eom

(10) Patent No.: US 9,252,195 B2
(45) Date of Patent: Feb. 2, 2016

(54) DISPLAY DEVICE

(71) Applicant: Samsung Display Co., Ltd., Yongin, Gyeonggi-Do (KR)

(72) Inventor: Tae Jong Eom, Cheonan-si (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/302,198

(22) Filed: Jun. 11, 2014

(65) Prior Publication Data

US 2015/0108441 A1    Apr. 23, 2015

(30) Foreign Application Priority Data

Oct. 21, 2013 (KR) .................. 10-2013-0125428

(51) Int. Cl.
*H01L 29/66* (2006.01)
*H01L 27/32* (2006.01)
*H01L 51/52* (2006.01)

(52) U.S. Cl.
CPC ........ *H01L 27/3258* (2013.01); *H01L 27/3246* (2013.01); *H01L 51/525* (2013.01); *H01L 51/5246* (2013.01)

(58) Field of Classification Search
CPC ..... H01L 27/15; H01L 21/82; H01L 51/5246; H01L 51/525
USPC .............................. 438/23; 257/258; 156/281
See application file for complete search history.

(56) References Cited

U.S. PATENT DOCUMENTS

| | | | | |
|---|---|---|---|---|
| 2001/0051398 A1* | 12/2001 | Hirakata et al. | ............. | 438/149 |
| 2005/0116245 A1 | 6/2005 | Aitken et al. | | |
| 2011/0102727 A1* | 5/2011 | Hirato | ........................... | 349/153 |
| 2012/0248950 A1* | 10/2012 | Niibori | ..................... | 312/223.1 |
| 2012/0268708 A1* | 10/2012 | Chida | .......................... | 349/153 |
| 2014/0014960 A1* | 1/2014 | Yamazaki et al. | ............. | 257/59 |

FOREIGN PATENT DOCUMENTS

| | | |
|---|---|---|
| KR | 10-0899447 B1 | 5/2009 |
| KR | 10-0965255 B1 | 6/2010 |
| KR | 10-2010-0137150 A | 12/2010 |
| KR | 10-2012-0088842 A | 8/2012 |

\* cited by examiner

*Primary Examiner* — Caridad Everhart
(74) *Attorney, Agent, or Firm* — Knobbe, Martens, Olson & Bear, LLP

(57) ABSTRACT

A display device is disclosed. In one aspect, the display device includes a first substrate including a display area and a non-display area surrounding the display area and a display unit formed over the first substrate in the display area and configured to display an image. The display device also includes a plurality of first reinforcing members formed over the first substrate in the non-display area, wherein the first reinforcing members are spaced apart from each other. The display device further includes a second substrate formed over the first substrate with the display unit interposed therebetween, and a sealant formed in the non-display area and substantially sealing the first and second substrates, wherein the sealant is interposed between the display area and the plurality of first reinforcing members.

19 Claims, 6 Drawing Sheets

DISPLAY DEVICE

CROSS-REFERENCE TO RELATED APPLICATIONS

This application claims priority to and the benefit of Korean Patent Application No. 10-2013-0125428 filed in the Korean Intellectual Property Office on Oct. 21, 2013, the entire contents of which are incorporated herein by reference.

BACKGROUND

1. Field

The described technology generally relates to a display device, and more particularly, to a display device including frit as a sealant.

2. Description of the Related Technology

Organic light-emitting diode (OLED) displays have recently received attention due to their distinguishing characteristics compared to traditional display devices.

OLED displays are self-luminous and do not require a separate light source, unlike liquid crystal displays (LCDs), and thus, can be manufactured to have a reduced thickness and weight. Further, OLED displays have favorable characteristics, such as low power consumption, high luminance, and fast response speeds.

SUMMARY OF CERTAIN INVENTIVE ASPECTS

One inventive aspect is a display device having an improved impact resistance.

Another aspect is a display device, including a first substrate including a display area and a non-display area surrounding the display area, a display unit positioned in the display area of the first substrate, and configured to display an image, a sealant positioned in the non-display area of the first substrate, and configured to surround the display unit, a plurality of first reinforcing parts positioned between the sealant and a border of the first substrate in the non-display area of the first substrate, and spaced apart from each other, and a second substrate positioned on the first substrate with the display unit interposed therebetween, and configured to seal the display unit together with the sealant and the first substrate.

The first reinforcing part may include a first sub-reinforcing part positioned on the first substrate, and a second sub-reinforcing part positioned between the first sub-reinforcing part and the second substrate.

The first sub-reinforcing part, the second sub-reinforcing part, or the first sub-reinforcing part and the second sub-reinforcing part may include an organic material.

The second sub-reinforcing part may be in contact with the second substrate.

The second sub-reinforcing part may be spaced apart from the second substrate.

The first sub-reinforcing part and the second sub-reinforcing part may be formed by using different photolithography processes, respectively.

The first sub-reinforcing part may be in contact with the first substrate.

The first sub-reinforcing part may be spaced apart from the first substrate with an insulating layer interposed therebetween.

The display unit may include a thin film transistor positioned on the first substrate, an organic insulating layer positioned on the thin film transistor, and including a contact hole through which a drain electrode of the thin film transistor is opened, a first electrode positioned on the organic insulating layer, and connected with the drain electrode through the contact hole, a pixel defining layer positioned on the first electrode, and including an opening configured to open one part of the first electrode, an organic emission layer positioned on the first electrode so as to correspond to the opening, and a second electrode positioned on the organic emission layer.

The first sub-reinforcing part may include the same material as that of the organic insulating layer and the second sub-reinforcing part may include the same material as that of the pixel defining layer.

The first sub-reinforcing part and the organic insulating layer may be simultaneously formed by using a first photolithography process forming the organic insulating layer and the second sub-reinforcing part and the pixel defining layer are simultaneously formed by using a second photolithography process forming the pixel defining layer.

A thickness of the first sub-reinforcing part may be adjusted by the first photolithography process and a thickness of the second sub-reinforcing part may be adjusted by the second photolithography process.

The first substrate may be shaped like a polygon and each of the plurality of first reinforcing parts may be adjacently positioned to a corner of the first substrate.

The first substrate may be shaped like a quadrangle and the plurality of first reinforcing parts may be adjacently positioned to four corners of the first substrate, respectively.

The display device may further include a second reinforcing part positioned between the sealant and the first reinforcing part in the non-display area of the first substrate, and configured to surround the sealant.

The second reinforcing part may include an organic material.

The sealant may be frit.

Another aspect is a display device including first and second substrates opposing each other, wherein at least one of the substrates includes a display area and a non-display area surrounding the display area and a plurality of first reinforcing members interposed between the substrates in the non-display area, wherein the first reinforcing members are formed adjacent to edges of the substrates.

The display device further includes an organic insulating layer formed over the first substrate in the display area and a pixel defining layer formed over the first substrate in the display area, wherein each of the first reinforcing members includes first and second sub-reinforcing members, wherein the first sub-reinforcing members are formed of the same material as that of the organic insulating layer, and wherein the second sub-reinforcing members are formed of the same material as that of the pixel defining layer.

Each of the first reinforcing members has an L-shape or a substantially reverse L-shape. The display device further includes a second reinforcing member formed in the non-display area to be closer to the display area than the first reinforcing members, wherein the second reinforcing member continuously surrounds the display area.

The display device further includes a sealant substantially sealing the substrates and formed only in the non-display area, wherein the sealant is closer to the display area than the second reinforcing member. The substrates each have a quadrangular shape and the first reinforcing members are respectively formed adjacent to one of the four corners of the substrates.

According to at least one embodiment, a display device has an improved impact resistance.

DETAILED DESCRIPTION OF CERTAIN INVENTIVE EMBODIMENTS

Figure 1:
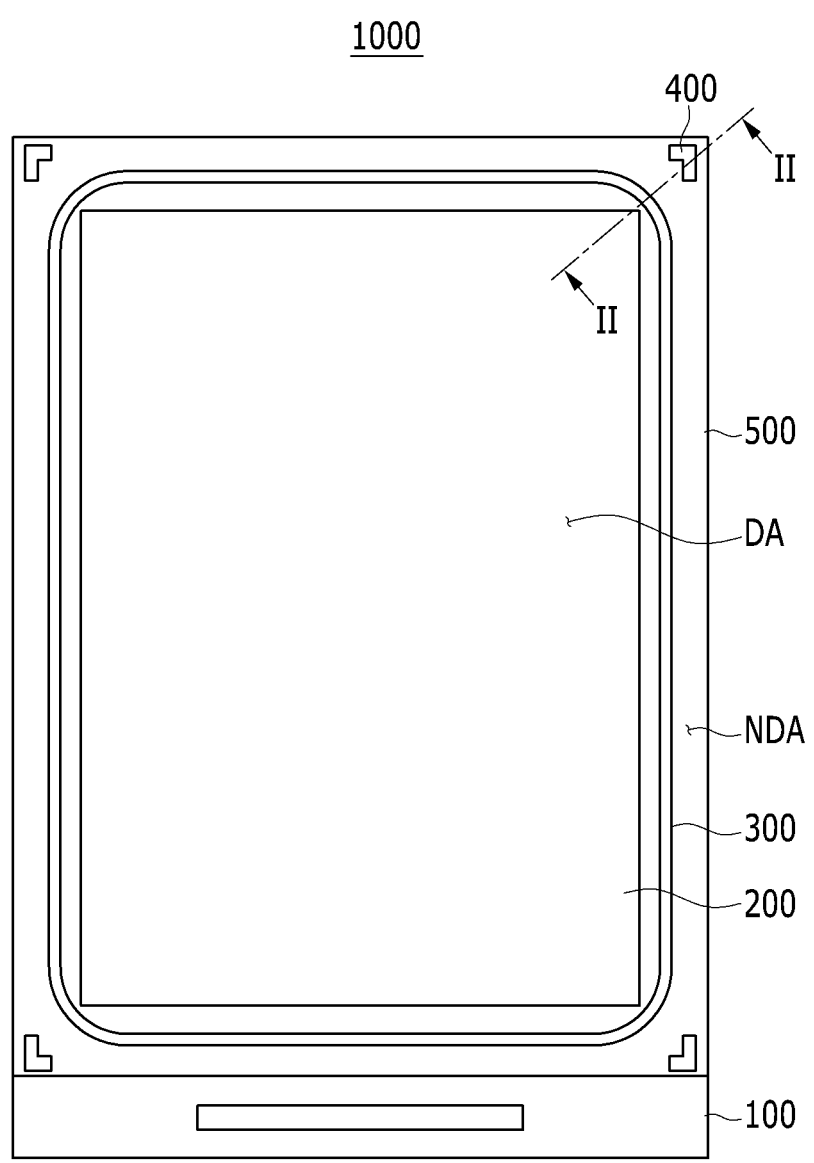
FIG. 1 is a top plan view illustrating a display device according to a first exemplary embodiment.

The standard OLED display includes a first substrate, an OLED formed on the first substrate, a second substrate facing the first substrate with the OLED interposed therebetween, and a sealant, such as frit, for bonding and sealing the first substrate to the second substrate.

When at least one of the first and second substrates of the OLED display is formed of a brittle material, such as glass, the edges of the display are vulnerable to being damaged from external impact, such as will result from being dropped.

In the following detailed description, only certain exemplary embodiments have been shown and described, simply by way of illustration. As those skilled in the art would realize, the described embodiments may be modified in various different ways, all without departing from the spirit or scope of the described technology.

In describing the described technology, descriptions unrelated to the described technology will be omitted. Like reference numerals generally designate like elements throughout the specification.

In addition, in various exemplary embodiments, the same reference numerals are used to refer to the constituent elements having the same constitution illustrated in the first exemplary embodiment. In the other exemplary embodiments, only configurations that are different from the first exemplary embodiment are illustrated.

In addition, the size and thickness of each component shown in the drawings may be exaggerated for understanding and ease of description, but the described technology is not limited thereto.

In the drawings, the thicknesses of layers, films, panels, regions, etc., may be exaggerated for clarity. It will be understood that when an element such as a layer, film, region, or substrate is referred to as being "on" another element, it can be directly on the other element or intervening elements may also be present.

In addition, unless explicitly described to the contrary, the word "comprise" and variations such as "comprises" or "comprising", will be understood to imply the inclusion of stated elements but not the exclusion of any other elements. Further, in the specification, the word "on" means positioning on or below the object portion, but does not essentially mean positioning on the upper side of the object portion based on the orientation of the device.

Hereinafter, a display device according to a first exemplary embodiment will be described with reference to FIGS. 1 and 2. Hereinafter, the display device will be described based on an embodiment of an OLED display, however, in other exemplary embodiments, the display device may be a liquid crystal display (LCD) or the like in which two substrates are bonded by a sealant.

FIG. 1 is a top plan view illustrating a display device according to a first exemplary embodiment. FIG. 2 is a cross-sectional view taken along line II-II of FIG. 1.

Figure 2:
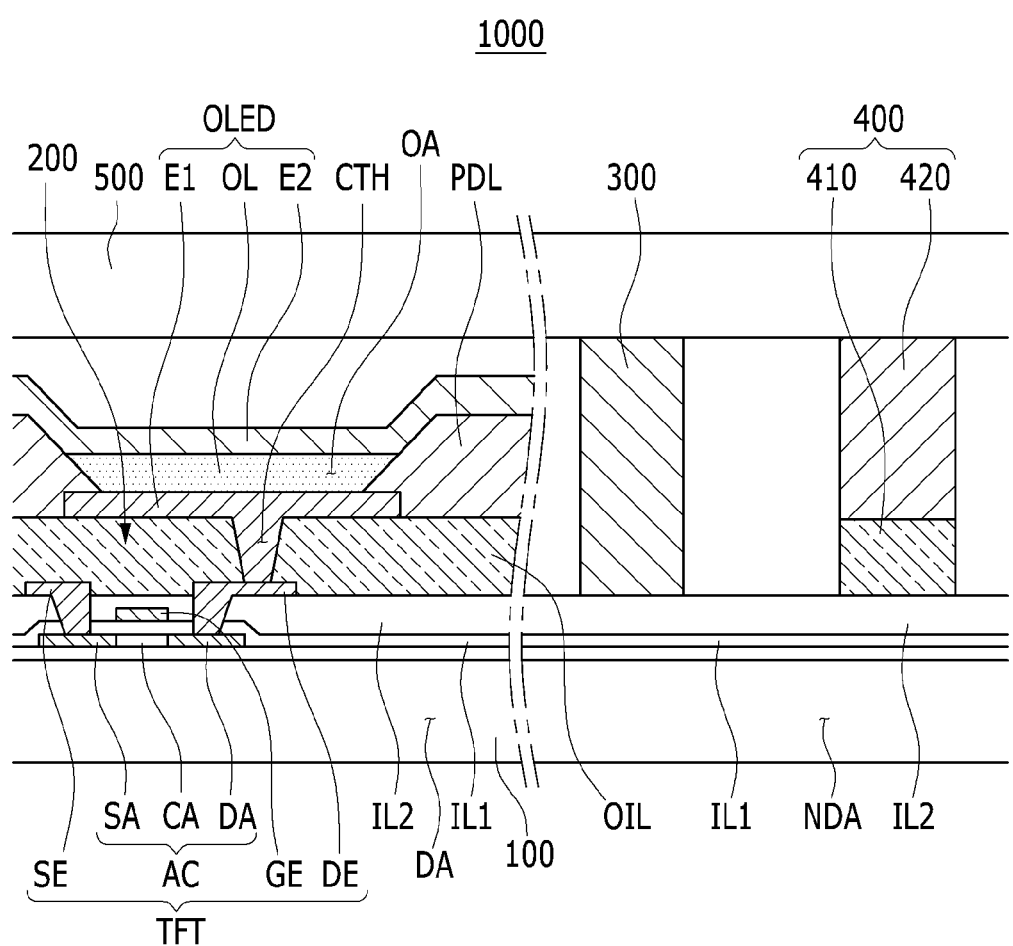
FIG. 2 is a cross-sectional view taken along line II-II of FIG. 1.

As illustrated in FIGS. 1 and 2, the display device 1000 device according to the first exemplary embodiment includes a first substrate 100, a display unit 200, a sealant 300, first reinforcing parts or first reinforcing members 400, and a second substrate 500.

The first substrate 100 is an insulating substrate including glass, polymer, stainless steel, or the like, and the first substrate 100 may be formed of a light transmissive material. In some embodiments, the first substrate 100 is shaped like a polygon and has a quadrangular shape.

According to other exemplary embodiments the first substrate 100 may have another polygonal shape, such as a triangle, a pentagon, a hexagon, a heptagon, or an octagon.

The first substrate 100 includes a display area DA and a non-display area NDA.

The display area DA is positioned at the center of the first substrate 100, the display unit 200 is formed in the display area DA, and an image is displayed in the display area DA by the display unit 200.

The non-display area NDA surrounds the display area DA and is formed as a closed loop between the center and the edges of the first substrate 100. The sealant 300 and the first reinforcing part 400 are positioned in the non-display area NDA.

The display unit 200 is positioned in the display area DA of the first substrate 100 and emits light to display an image.

The display unit 200 includes a thin film transistor TFT, an organic insulating layer OIL, a first electrode E1, a pixel defining layer PDL, an organic emission layer OL, and a second electrode E2.

The thin film transistor TFT is formed on the first substrate 100 and is included in a pixel circuit (not illustrated). Here, the pixel circuit may include a plurality of thin film transistors, one or more capacitors, a plurality of scan lines, one or more data lines, and the like. The pixel circuit may be formed to have various structures within the scope in which those skilled in the art may easily modify and carry out the pixel circuit.

The thin film transistor TFT includes an active layer AC, a gate electrode GE, a source electrode SE, and a drain electrode DE.

The active layer AC includes a source area SA, a channel area CA, and a drain area DA and may be formed of polysilicon or an oxide semiconductor. The oxide semiconductor may include any one of oxides including titanium (Ti), hafnium (Hf), zirconium (Zr), aluminum (Al), tantalum (Ta), germanium (Ge), zinc (Zn), gallium (Ga), tin (Sn), or indium (In) as a base, and complex oxides thereof, such as zinc oxide (ZnO), indium-gallium-zinc oxide (InGaZnO$_4$), indium-zinc oxide (Zn—In—O), zinc-tin oxide (Zn—Sn—O), indium-gallium oxide (In—Ga—O), indium-tin oxide (In—Sn—O), indium-zirconium oxide (In—Zr—O), indium-zirconium-zinc oxide (In—Zr—Zn—O), indium-zirconium-tin oxide (In—Zr—Sn—O), indium-zirconium-gallium oxide (In—Zr—Ga—O), indium-aluminum oxide (In—Al—O), indium-zinc-aluminum oxide (In—Zn—Al—O), indium-tin-aluminum oxide (In—Sn—Al—O), indium-aluminum-gallium oxide (In—Al—Ga—O), indium-tantalum oxide (In—Ta—O), indium-tantalum-zinc oxide (In—Ta—Zn—O), indium-tantalum-tin oxide (In—Ta—Sn—O), indium-tantalum-gallium oxide (In—Ta—Ga—O), indium-germanium oxide (In—Ge—O), indium-germanium-zinc oxide (In—Ge—Zn—O), indium-germanium-tin oxide (In—Ge—Sn—O), indium-germanium-gallium oxide (In—Ge—Ga—O), titanium-indium-zinc oxide (Ti—In—Zn—O), or hafnium-indium-zinc oxide (Hf—In—Zn—O). An impurity may be doped in each of the source and drain areas SA and DA and the impurity may be changed according to the type of thin film transistor. For example, the impurity may be an N-type impurity or a P-type impurity.

The gate electrode GE is formed over the channel area CA of the active layer AC with a first insulating layer IL1 interposed therebetween.

The source and drain electrodes SE and DE are formed over the active layer AC with the first insulating layer IL1 and a second insulating layer IL2 interposed therebetween. The source and drain electrodes SE and DE are respectively connected to the source and drain areas SA and DA of the active layer AC through the first and second insulating layers IL1 and IL2.

Here, each of the first and second insulating layers IL1 and IL2 may include an organic material or an inorganic material, such as silicon oxide SiOx or silicon nitride SiNx, and may be formed in a single layer or a plurality of layers.

The organic insulating layer OIL is formed on the source and drain electrodes SE and DE of the thin film transistor TFT and includes an organic material including a photoresist material. The organic insulating layer OIL includes a contact hole CTH exposing the drain electrode DE of the thin film transistor TFT. The organic insulating layer OIL including the contact hole CTH may be formed by a first photolithography process. For example, the first photolithography process may be performed by forming a first photoresist layer on the thin film transistor TFT, exposing the first photoresist layer by using a mask, and developing the first photoresist layer. The organic insulating layer OIL including the contact hole CTH is formed by the first photolithography process. Further, a first sub-reinforcing part or first sub-reinforcing member 410 of the first reinforcing part 400 to be described below is formed by the first photolithography process forming the organic insulating layer OIL. That is, the organic insulating layer OIL and the first sub-reinforcing part 410 are simultaneously formed by the first photolithography process and the organic insulating layer OIL and the first sub-reinforcing part 410 are formed of the same organic material.

The first electrode E1 is formed on the organic insulating layer OIL and is connected to the drain electrode DE through the contact hole CTH. The first electrode E1 may be formed of a light reflective electrode, a light transmitting electrode, or a light transflective electrode. The first electrode E1 may be formed as an anode electrode or a cathode electrode. The first electrode E1 may be formed to correspond to one pixel. Here, a pixel is a minimum unit for displaying an image.

The pixel defining layer PDL is formed on the first electrode E1 and includes an opening OA exposing a center region of the first electrode E1, which is one portion of the first electrode E1. The pixel defining layer PDL includes an organic material including a photoresist material. The pixel defining layer PDL including the opening OA may be formed by using a second photolithography process. For example, the second photolithography process may be performed by forming a second photoresist layer on the first electrode E1, exposing the second photoresist layer by using a mask, and developing the second photoresist layer. The pixel defining layer PDL including the opening OA is formed by the second photolithography process. Further, a second sub-reinforcing part or second reinforcing member 420 of the first reinforcing part 400 to be described below is formed by the second photolithography process forming the pixel defining layer PDL. That is, the pixel defining layer PDL and the second sub-reinforcing part 420 are simultaneously formed by the second photolithography process and the pixel defining layer PDL and the second sub-reinforcing part 420 are formed of the same organic material.

Moreover, a spacer may be formed on the pixel defining layer PDL and the spacer may be integrally formed with the pixel defining layer PDL by the second photolithography process forming the pixel defining layer PDL, or may be formed of a different material from that of the pixel defining layer PDL by another process.

The organic emission layer OL is formed on the first electrode E1 in an area corresponding to the opening OA. The organic emission layer OL may be formed in a multilayer including one or more of a hole injection layer (HIL), a hole transporting layer (HTL), an emission layer an electron transporting layer (ETL), and an electron injection layer (EIL). When the organic emission layer OL includes all of the hole injection layer (HIL), the hole transporting layer (HTL), the emission layer, the electron transporting layer (ETL), and the electron injection layer (EIL), the hole injection layer is formed on the first electrode E1, which is an anode, and the hole transporting layer, the emission layer, the electron transporting layer, and the electron injection layer are sequentially stacked on the hole injection layer.

Emission layers of the organic emission layer OL may include red, green, and blue organic emission layers respectively emitting red, green, and blue light. The red, green, and blue organic emission layers are respectively formed in red, green, and blue pixels to implement a color image.

Further, the organic emission layer OL may implement the color image by stacking all of the red, green, and blue organic emission layers together and respectively forming red, green, and blue color filters for each pixel. In other embodiments, the organic emission layer OL includes a white organic emission layer emitting white light in all of the red, green, and blue pixels and red, green, and blue color filters are formed for each pixel. When the color image is implemented by using the white organic emission layer and the color filter, it is not necessary to use deposition masks for depositing the red, green, and blue organic emission layers on the respective pixels, that is, the red, green, and blue pixels. The white organic emission layer described in another embodiment may be formed of one organic emission layer as a matter of course and includes even a constitution where a plurality of organic emission layers are stacked to emit white light. For example, the white organic emission layer may also include at least one yellow organic emission layer and at least one blue organic emission layer combined to emit white light, at least one cyan organic emission layer and at least one red organic emission layer combined to emit white light, or at least one magenta organic emission layer and at least one green organic emission layer combined to emit white light.

The second electrode E2 is formed on the organic emission layer OL. The second electrode E2 may be formed of a light reflective electrode, a light transmitting electrode, or a light transflective electrode. The second electrode E2 may be formed as an anode electrode or a cathode electrode. The second electrode E2 may be formed in one circular plate over all of the pixels.

The second electrode E2, the organic emission layer OL, and the first electrode E1 form an organic light-emitting diode (OLED).

The aforementioned display unit 200 includes the OLED, but in other exemplary embodiments, the display unit may include a liquid crystal. In these embodiments, the display unit may display an image by using liquid crystal.

The sealant 300 is formed in the non-display area NDA of the first substrate 100 and surrounds the display unit 200 as a closed loop. The sealant 300 is interposed between the first substrate 100 and the second substrate 500 to bond the first and second substrates 100 and 500 to each other. The sealant also seals the display unit 200 together with the first substrate 100 and the second substrate 500. The sealant 300 includes frit, and the like, and hardened by a hardening means, such as laser. Additionally, the sealant 300 may be formed of an organic material, such as epoxy.

The first reinforcing part 400 is formed in the non-display area NDA of the first substrate 100 and is interposed between the first substrate 100 and the second substrate 500. The first reinforcing part 400 is also formed between the sealant 300 and the edge of the first substrate 100. A plurality of first reinforcing parts 400 are formed the first reinforcing parts 400 are spaced apart from each other. Each of the first reinforcing parts 400 is formed adjacent to a corner of the quadrangular first substrate 100. In the embodiment of FIG. 1, the number of first reinforcing parts 400 is four and the four first reinforcing parts 400 are spaced apart from each other to be adjacently positioned in the four corners of the first substrate 100. The first reinforcing part 400 has a shape corresponding to the shape of the corners of the first substrate 100. In the embodiment of FIG. 1, the first substrate 100 has a rectangular shape, so that the first reinforcing part 400 has an L-shape so as to correspond to the corner of the rectangle.

The first reinforcing part 400 includes an organic material and includes the first sub-reinforcing part 410 and the second sub-reinforcing part 420.

The first sub-reinforcing part 410 is formed on the first substrate 100 and includes an organic material including a photoresist material. As described above, the first sub-reinforcing part 410 and the organic insulating layer OIL are simultaneously formed by the first photolithography process forming the organic insulating layer OIL. That is, the first sub-reinforcing part 410 is formed by using a photolithography process different from that of the second sub-reinforcing part 420. The first sub-reinforcing part 410 includes the same organic material as that of the organic insulating layer OIL. The first sub-reinforcing part 410 is formed on the second insulating layer IL2 and is spaced apart from the first substrate 100 with the first and second insulating layers IL1 and IL2 interposed therebetween. That is, the first sub-reinforcing part 410 contacts the second insulating layer IL2 and when the second insulating layer IL2 includes an organic material, the first sub-reinforcing part 410 is bonded to the second insulating layer IL2 with a high bonding strength therebetween. The first sub-reinforcing part 410 is formed by the first photolithography process so that a thickness thereof is adjusted by exposure and development of the first photolithography process.

According to other embodiments, the first sub-reinforcing part 410 is formed by the photolithography process forming the second insulating layer IL2, not by the first photolithography process forming the organic insulating layer OIL. In these embodiments, when the second insulating layer IL2 includes an inorganic material, the first sub-reinforcing part 410 may include the same inorganic material as that of the second insulating layer IL2.

The second sub-reinforcing part 420 is formed between the first sub-reinforcing part 410 and the second substrate 500 and includes an organic material including a photoresist material. As described above, the second sub-reinforcing part 420 and the pixel defining layer PDL are simultaneously formed by using the second photolithography process forming the pixel defining layer PDL. That is, the second sub-reinforcing part 420 is formed by using a photolithography process different from that of the first sub-reinforcing part 410. The second sub-reinforcing part 420 includes the same organic material as that of the pixel defining layer PDL. As described above, one or more of the second sub-reinforcing part 420 and the first sub-reinforcing part 410 include an organic material and the first reinforcing part 400 includes the organic material.

The second sub-reinforcing part 420 is in contact with the second substrate 500 and thus the strength of the edges near the corners of the second substrate 500 is reinforced, and general impact resistance of the display device 1000 is improved.

The second sub-reinforcing part 420 is formed by the second photolithography process, so that a thickness thereof is adjusted by exposure and development of the second photolithography process. As described above, the thickness of each of the first and second sub-reinforcing parts 410 and 420 is adjusted so that the entire height of the first reinforcing part 400 is adjusted. Accordingly, the strength between the edges near the corners of the first substrate 100 on which the first reinforcing part 400 is formed and the edges near the corners of the second substrate 500 is reinforced so that general impact resistance of the display device 1000 is improved.

The second substrate 500 is formed on the first substrate 100 with the display unit 200, the sealant 300, and the first reinforcing part 400 interposed therebetween. The display unit 200 is sealed by the second substrate 500, the sealant 300, and the first substrate 100. The second substrate 500 is an insulating substrate including glass, polymer, stainless steel, or the like, and the second substrate 500 may be formed of a light transmissive material. The second substrate 500 has a polygon shape and, in some embodiments, has a quadrangular shape. In other exemplary embodiments, the second substrate 500 may have another polygonal shape, such as a triangle, a pentagon, a hexagon, a heptagon, or an octagon.

As described above, in the display device 1000 according to the first exemplary embodiment, the first reinforcing parts 400 are spaced apart from each other and formed between the sealant 300 and the border of the first substrate 100 in the non-display area NDA of the first substrate 100. Thus, the strength between the edges near the corners of the first substrate 100 and the edges near the corners of the second substrate 500 is reinforced, thereby improving general impact resistance of the display device 1000. That is, the amount of damage to edge portions of the display device 1000 due to external impact, such as when the display device 1000 is dropped, is reduced.

Further, in the display device 1000 according to the first exemplary embodiment, the first and second sub-reinforcing parts 410 and 420 of the first reinforcing part 400 are formed so that the thicknesses thereof are adjusted by the different photolithography processes, so that it is possible to easily adjust a general height of the first reinforcing part 400. Accordingly, the strength between the edges near the corners of the first substrate 100 and the edges near the corners of the second substrate 500 is optimally reinforced by adjusting the height of the first reinforcing part 400 to an optimal height so that general impact resistance of the display device 1000 is improved.

Further, in the display device 1000 according to the first exemplary embodiment, each of the first and second sub-reinforcing parts 410 and 420 of the first reinforcing part 400 is formed by using the photolithography process so that an area of each of the first and second sub-reinforcing parts 410 and 420 can be adjusted to a nano or micro precision. That is, the area of the first reinforcing part 400 is adjusted to an optimal size, so that the strength between the edges near the corners of the first substrate 100 and the edges near the corners of the second substrate 500 is optimally reinforced to provide strength to the entire area of the display device 1000, thereby improving impact resistance over the entire area of the display device 1000.

Further, in the display device 1000 according to the first exemplary embodiment, the first sub-reinforcing part 410 of the first reinforcing part 400 and the organic insulating layer OIL are simultaneously formed by the first photolithography process forming the organic insulating layer OIL of the display unit 200. Similarly, the second sub-reinforcing part 420 and the pixel defining layer PDL are simultaneously formed by the second photolithography process forming the pixel defining layer PDL of the display unit 200. Thus, additional processes for forming the first reinforcing part 400 are not required. That is, even though the first reinforcing part 400 is included in order to improve impact resistance, an additional process for forming the first reinforcing part 400 is not required, thereby providing the display device 1000 with an overall decrease in manufacturing time and manufacturing cost.

Hereinafter, a display device according to a second exemplary embodiment will be described with reference to FIG. 3.

Hereinafter, only characteristic portions that are different from the first exemplary embodiment will be described and those portions not described are the same as in the first exemplary embodiment. Further, for convenience of the description, in the second exemplary embodiment, the same constituent elements are denoted by the same reference numerals as those of the first exemplary embodiment.

Figure 3:
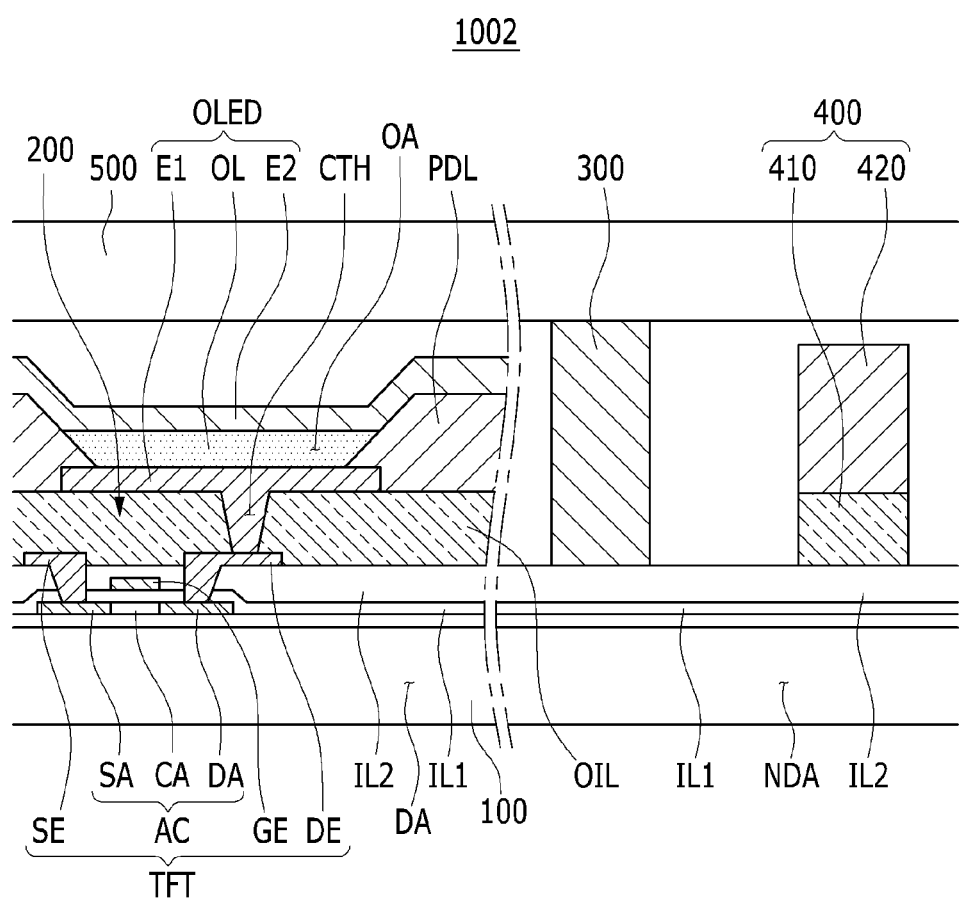
FIG. 3 is a cross-sectional view illustrating a display device according to a second exemplary embodiment.

FIG. 3 is a cross-sectional view illustrating the display device according to the second exemplary embodiment.

As illustrated in FIG. 3, the thickness of a second sub-reinforcing part 420 of a first reinforcing part 400 of a display device 1002 according to the second exemplary embodiment is adjusted by a second photolithography process, so that the second sub-reinforcing part 420 of the first reinforcing part 400 is spaced apart from a second substrate 500. Accordingly, even though the edges near corners of the second substrate 500 can be bent in the direction of the second sub-reinforcing part 420 due to external force, the second sub-reinforcing part 420 prevents the edges of the corners of the second substrate 500 from being bent more than a predetermined amount, so that the edges of the corners of the second substrate 500 are prevented from exceeding a yielding point and being damaged.

That is, the display device 1002 of the second embodiment is suppressed from being damaged due to external force.

Hereinafter, a display device according to a third exemplary embodiment will be described with reference to FIG. 4.

Hereinafter, only characteristic portions that are different from the first exemplary embodiment will be described and those portions not described are the same as in the first exemplary embodiment. Further, for convenience of the description, in the third exemplary embodiment, the same constituent elements are denoted by the same reference numerals as those of the first exemplary embodiment.

Figure 4:
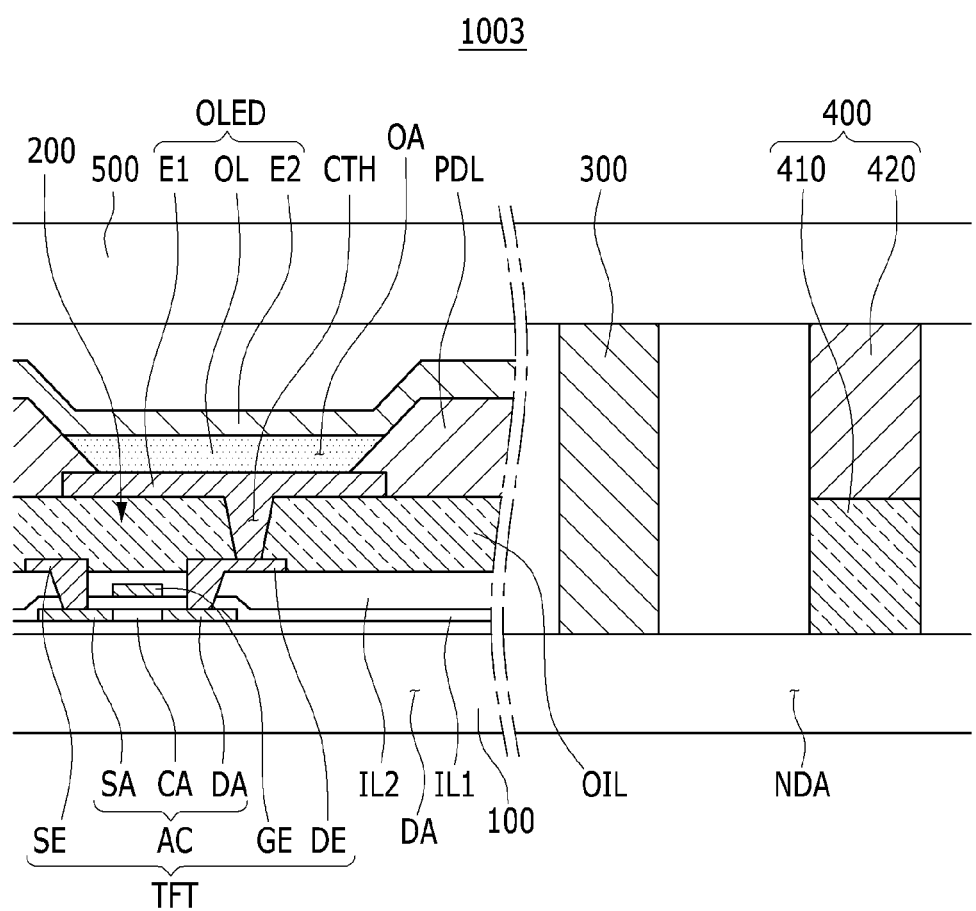
FIG. 4 is a cross-sectional view illustrating a display device according to a third exemplary embodiment.

FIG. 4 is a cross-sectional view illustrating a display device according to the third exemplary embodiment.

As illustrated in FIG. 4, a first sub-reinforcing part 410 of a display device 1003 according to the third exemplary embodiment is in contact with a first substrate 100. First and second insulating layers IL1 and IL2 formed in a non-display area NDA of the first substrate 100 are removed by dry etching or wet etching, and thus, the first sub-reinforcing part 410 formed by using the same first photolithography process as that of an organic insulating layer OIL is in contact with the first substrate 100.

As described above, in the display device 1003 according to the third exemplary embodiment, the first sub-reinforcing part 410 is in contact with the first substrate 100, so that it is not necessary to consider the thickness of each of the first and second insulating layers IL1 and IL2 when the overall height of a first reinforcing part 400 is adjusted. That is, the height of the first reinforcing part 400 is more easily adjusted, so that the display device 1003 has an improved impact resistance against external force.

Hereinafter, a display device according to a fourth exemplary embodiment will be described with reference to FIGS. 5 and 6.

Figure 5:
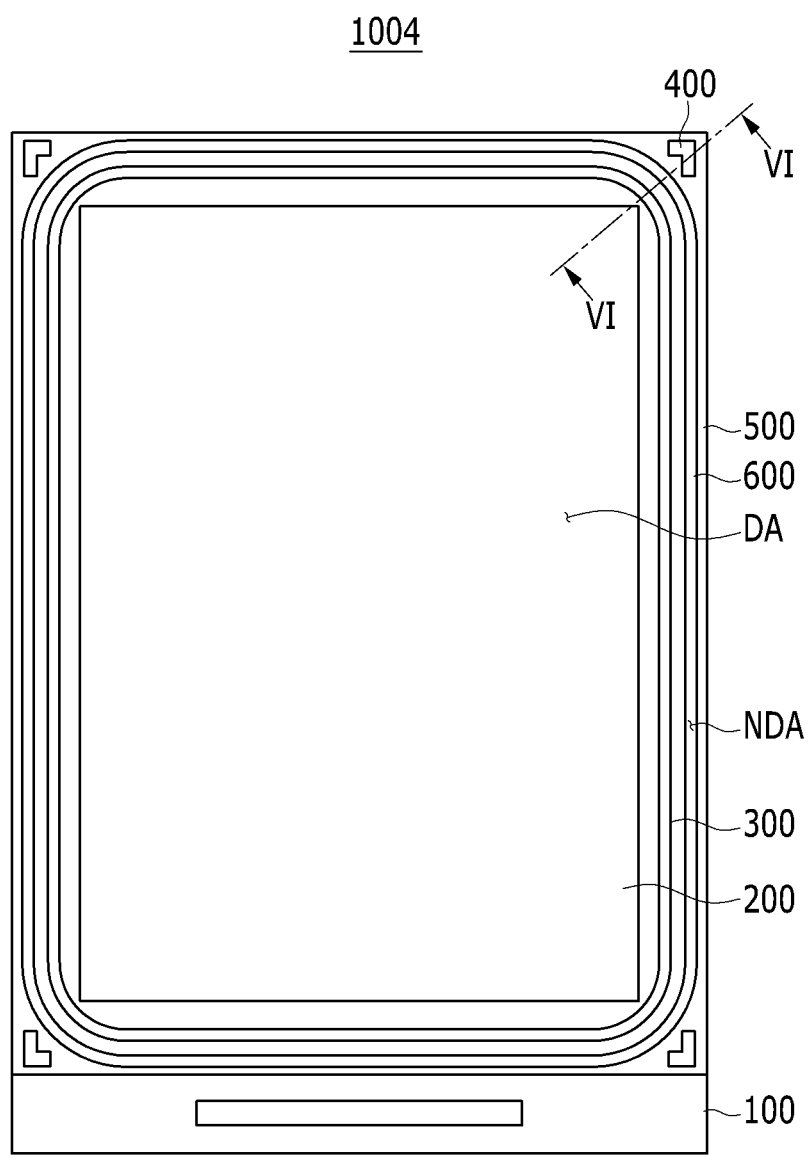
FIG. 5 is a top plan view illustrating a display device according to a fourth exemplary embodiment.

FIG. 5 is a top plan view illustrating a display device according to the fourth exemplary embodiment. FIG. 6 is a cross-sectional view taken along line VI-VI of FIG. 5.

Hereinafter, only characteristic portions that are different from the first exemplary embodiment will be described and those portions not described are the same as in the first exemplary embodiment. Further, for convenience of the description, in the fourth exemplary embodiment, the same constituent elements are denoted by the same reference numerals as those of the first exemplary embodiment.

Figure 6:
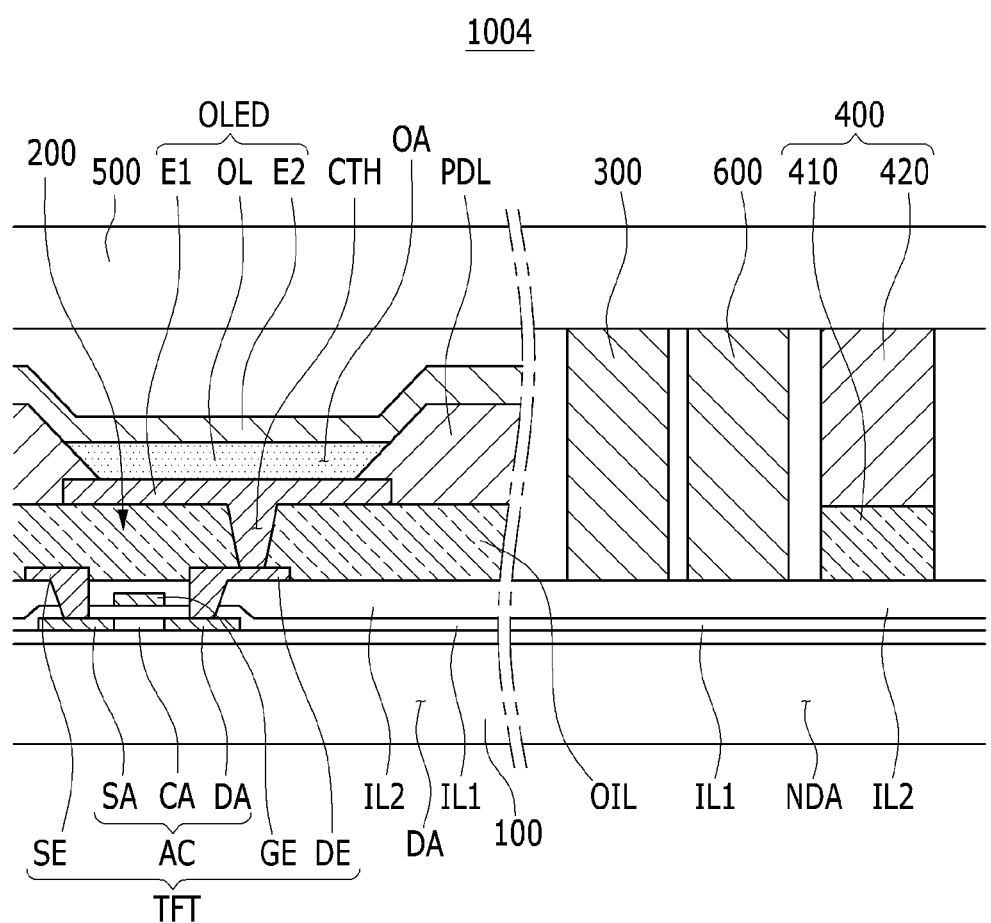
FIG. 6 is a cross-sectional view taken along line VI-VI of FIG. 5.

As illustrated in FIGS. 5 and 6. a display device 1004 according to the fourth exemplary embodiment includes a first substrate 100, a display unit 200, a sealant 300, a first reinforcing part 400, a second substrate 500, and a second reinforcing part 600.

The second reinforcing part 600 is formed in a non-display area (NDA) of the first substrate 100 between the first and second substrates 100 and 500. The second reinforcing part 600 is formed between the sealant 300 and the first reinforcing part 400 in the non-display area (NDA) of the first substrate 100 and surrounds the sealant 300 to form a closed loop. The second reinforcing part 600 may be formed between the first and second substrates 100 and 500 to bond the first substrate 100 and the second substrate 500 together with the sealant 300. The second reinforcing part 600 may include an organic material, such as epoxy.

As described above, the display device 1004 according to the fourth exemplary embodiment includes the second reinforcing part 600, which is formed between the sealant 300 and the first reinforcing part 400 and includes an organic material having a plastic property. Consequently, the strength between edges near corners of the first substrate 100 and edges near corners of the second substrate 500 is reinforced being overlapped by each of the first reinforcing part 400 and the second reinforcing part 600, thereby improving general impact resistance of the display device 1004. That is, the display device 1004 according to the fourth embodiment reduces damage to the edge portions due to external impacts, such as occur when the display device 1004 is dropped.

While the described technology has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A display device, comprising:
   a first substrate including a display area and a non-display area surrounding the display area;
   a display unit formed over the first substrate in the display area and configured to display an image;
   a plurality of first reinforcing members formed over the first substrate in the non-display area, wherein the first reinforcing members are spaced apart from each other;

a second substrate formed over the first substrate with the display unit interposed therebetween; and a sealant formed in the non-display area and substantially sealing the first and second substrates, wherein the sealant is interposed between the display area and the plurality of first reinforcing members, wherein each of the first reinforcing members includes:
   a first sub-reinforcing member formed over the first substrate; and
   a second sub-reinforcing member formed between the first sub-reinforcing member and the second substrate.

2. The display device of claim 1, wherein at least one of the first and second sub-reinforcing members is formed at least partially of an organic material.

3. The display device of claim 1, wherein each of the second sub-reinforcing members contacts the second substrate.

4. The display device of claim 1, wherein each of the second sub-reinforcing members is spaced apart from the second substrate.

5. The display device of claim 1, wherein the first sub-reinforcing members and the second sub-reinforcing members are formed by different photolithography processes, respectively.

6. The display device of claim 1, wherein each of the first sub-reinforcing members contacts the first substrate.

7. The display device of claim 1, wherein each of the first sub-reinforcing members is spaced apart from the first substrate with an insulating layer interposed therebetween.

8. The display device of claim 1, wherein the sealant comprises frit.

9. The display device of claim 1, wherein the display unit includes:
   a plurality of thin film transistors formed over the first substrate, wherein each thin film transistor includes a drain electrode;
   an organic insulating layer formed over the thin film transistors and defining a plurality of contact holes corresponding to the drain electrodes;
   a plurality of first electrodes formed over the organic insulating layer and corresponding to the drain electrodes, wherein each of the first electrodes is electrically connected to the corresponding drain electrode through the respective contact hole;
   a pixel defining layer formed over the first electrodes and defining a plurality of openings, wherein each opening corresponds to a portion of one of the first electrodes;
   a plurality of organic emission layers respectively formed over the first electrodes in the openings; and
   a second electrode formed over the organic emission layers and the pixel defining layer.

10. The display device of claim 9, wherein each of the first sub-reinforcing members is formed of the same material as that of the organic insulating layer and wherein the second sub-reinforcing member is formed of the same material as that of the pixel defining layer.

11. The display device of claim 10, wherein the first sub-reinforcing members and the organic insulating layer are substantially simultaneously formed by using a first photolithography process forming the organic insulating layer, and the second sub-reinforcing members and the pixel defining layer are substantially simultaneously formed by using a second photolithography process forming the pixel defining layer.

12. The display device of claim 11, wherein the thickness of the first sub-reinforcing members is adjusted by the first photolithography process and wherein the thickness of the second sub-reinforcing members is adjusted by the second photolithography process.

13. The display device of claim 1, wherein the first substrate has a polygonal shape and wherein at least one of the first reinforcing members is formed adjacent to a corner of the first substrate.

14. The display device of claim 13, wherein the first substrate has a quadrangular shape and wherein the first reinforcing members are respectively formed adjacent to one of the four corners of the first substrate.

15. The display device of claim 1, further comprising a second reinforcing member formed over the first substrate between the sealant and the first reinforcing member in the non-display area, wherein the second reinforcing member surrounds the sealant.

16. The display device of claim 15, wherein the second reinforcing member is formed at least in part of an organic material.

17. A display device, comprising:
   first and second substrates opposing each other, wherein at least one of the substrates includes a display area and a non-display area surrounding the display area; and
   a plurality of first reinforcing members interposed between the substrates in the non-display area, wherein the first reinforcing members are formed adjacent to edges of the substrates,
   wherein each of the first reinforcing members comprises first and second sub-reinforcing members, and
   wherein each of the second sub-reinforcing member is formed between the corresponding first sub-reinforcing member and the second substrate.

18. The display device of claim 17, further comprising:
   an organic insulating layer formed over the first substrate in the display area; and
   a pixel defining layer formed over the first substrate in the display area,
   wherein the first sub-reinforcing members are formed of the same material as that of the organic insulating layer, and
   wherein the second sub-reinforcing members are formed of the same material as that of the pixel defining layer.

19. The display device of claim 17, wherein each of the first reinforcing members has an L-shape or a substantially reverse L-shape.

* * * * *